(12) United States Patent
Huang et al.

(10) Patent No.: US 7,021,366 B2
(45) Date of Patent: Apr. 4, 2006

(54) HEAT DISSIPATION APPARATUS AND METHOD

(75) Inventors: Chiang-Cheng Huang, Miaoli (TW); Chien-Chung Sun, Taipei (TW)

(73) Assignee: Risun Expanse Corp., Taipei (TW)

( * ) Notice: Subject to any disclaimer, the term of this patent is extended or adjusted under 35 U.S.C. 154(b) by 0 days.

(21) Appl. No.: 10/986,198

(22) Filed: Nov. 12, 2004

(65) Prior Publication Data

US 2006/0042784 A1  Mar. 2, 2006

(30) Foreign Application Priority Data

Aug. 27, 2004  (TW) .............................. 93125957 A (51) Int. Cl.
*H05K 7/20* (2006.01)
*F28F 13/02* (2006.01)

(52) U.S. Cl. ....................... 165/80.3; 165/84; 165/185; 174/16.3; 257/722; 361/704

(58) Field of Classification Search ................... 165/84
See application file for complete search history.

(56) References Cited

U.S. PATENT DOCUMENTS

| 4,923,000 | A  | * | 5/1990 | Nelson ........................ 165/122 |
| 6,927,979 | B1 | * | 8/2005 | Watanabe et al. ........... 361/697 |
| 2005/0085879 | A1 | * | 4/2005 | Ahn et al. ..................... 607/96 |
| 2005/0177139 | A1 | * | 8/2005 | Yamazaki ....................... 606/9 |

\* cited by examiner

*Primary Examiner*—Leonard R. Leo
(74) *Attorney, Agent, or Firm*—Rabin & Berdo, P.C.

(57) ABSTRACT

A heat dissipation apparatus and method for dissipating heat from a heat source includes a thermal conductive element bonding to the heat source to transfer heat energy generated by the heat source and a vibration source located on the thermal conductive element to accelerate heat transfer to the edges of the thermal conductive element to perform heat exchange with external cooling air and improve cooling efficiency.

19 Claims, 10 Drawing Sheets

HEAT DISSIPATION APPARATUS AND METHOD

FIELD OF THE INVENTION

The present invention relates to a heat dissipation apparatus and method adopted for use on a heat source of electronic devices to facilitate heat dissipation of the heat source and maintain normal operation of the heat source.

BACKGROUND OF THE INVENTION

With the processing speed of the central processing unit (CPU) of the computer increasing constantly, heat energy generated by the CPU during operation also increases tremendously. In the past, CPU cooling was overlooked. As a result, the CPU generates a lot of heat energy and operates at high temperature. Not only the performance of the CPU suffers, its life span also shortens.

At present the general approach to resolve this problem is to add a radiator in contact with the CPU. The heat energy of the CPU transfers to the radiator, and the radiator has radiation fins to dissipate the heat energy. Heat may be transferred by conduction, convection and dissipation, and the radiator mentioned above dispels heat from the CPU by conduction. Namely a solid substance is used as a medium of heat transfer to dissipate heat. Conductive heat transfer is faster than other heat transfer methods. This is because the electrons of the medium molecules that have absorbed enough heat energy jump to a higher energy level and hit the electrons of the neighboring medium molecules. Further, the heat energy is transferred to the neighboring medium molecules, while the electrons that release the heat energy return to a lower energy level. Therefore, the heat energy may be transferred and dispelled.

The radiator generally has two types: one has dissipation fans, and the other does not have the dissipation fans. The radiator with a dissipation fan can generate cooling airflow to the radiation fins to increase cooling speed of the convection. It uses fluid as a heat transfer medium to dispel heat. It generally has a better cooling efficiency than the radiator without the dissipation fans.

On the heat dissipation methods for the CPU set forth above, the radiator is a solid substance, while the air is a fluid one. The distance between the medium molecules of the radiator is shorter that that of the air molecules. Most radiators are made of metal, and have more free electrons to transfer heat energy (because the medium molecules are confined in crystal lattice and cannot move). Hence heat transfer by conduction is faster than by convection.

However, in order to improve the performance of the dissipation fan, the dissipation fan usually is installed close to the radiator. Some even are mounted on one side or the top end of the radiator. This approach adds a heavy load to the CPU and increases the damage probability of the CPU.

Some conventional radiators alter the design of radiation fins or change the material of the radiation fins to improve cooling efficiency.

SUMMARY OF THE INVENTION

In view of the aforesaid problems, the primary object of the present invention is to provide a heat dissipation apparatus and method to improve cooling efficiency for a heat source and maintain normal operation of the heat source.

In order to achieve the foregoing object, the heat dissipation apparatus and method of the invention is for use on a heat source of electronic devices to dissipate heat from the heat source. A thermal conductive element is bonded to the heat source to transfer heat energy generated by the heat source. A vibration source is mounted onto the heat source to accelerate heat transfer from the thermal conductive element to the edges thereof to perform heat exchange with external cooling air, thereby improving cooling efficiency.

The vibration source is a micro motor, which has an eccentric rotor to generate vibration energy. A fan may be added to further improve cooling efficiency.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
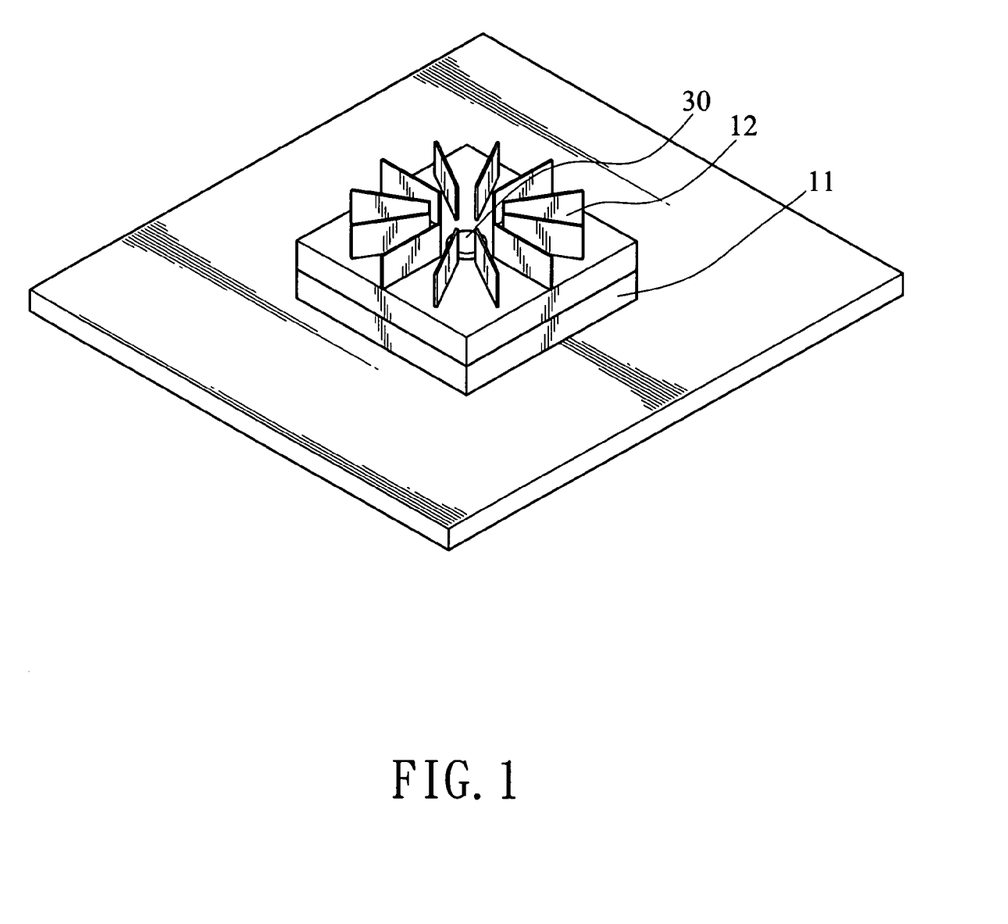
FIG. 1 is a schematic view of a first embodiment of the heat dissipation apparatus of the invention used on a CPU.
Figure 2:
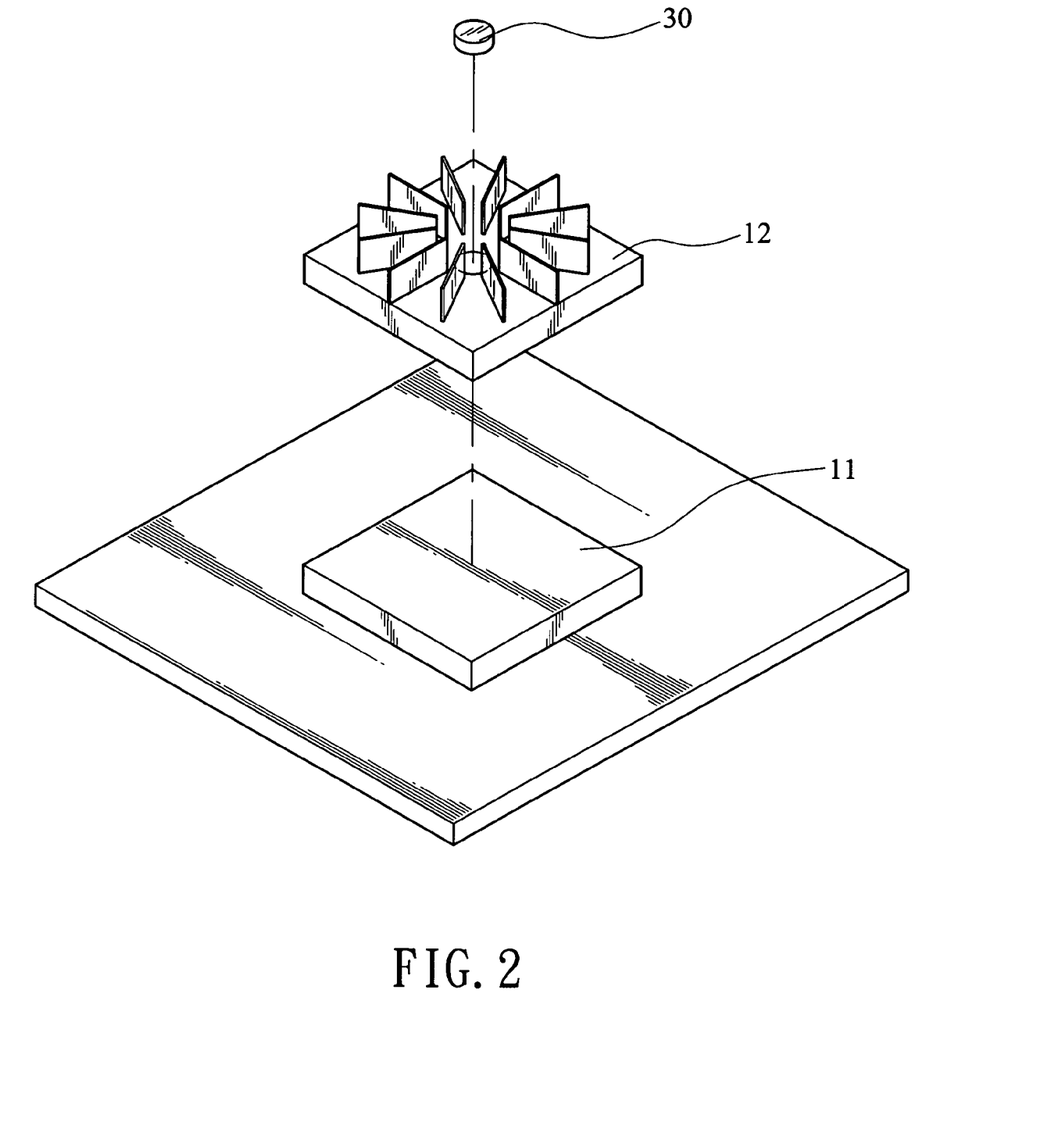
FIG. 2 is an exploded view of the first embodiment of the invention.

Refer to FIGS. 1 and 2 for the first embodiment of the heat dissipation apparatus of the invention used on a CPU. The heat dissipation apparatus according to the invention aims to dissipate heat from a heat source 11, which may be a heat-generating element of electronic devices. In a computer system, a CPU is the element that generates the most heat. In the first embodiment, a CPU is used as a heat source 11 for an example. The heat source 11 is bonded to a thermal conductive element 12. The thermal conductive element 12 shown in the drawings has radiation fins arranged in a radial manner. Heat energy generated by the heat source 11 is transferred to the thermal conductive element 12 by conduction. After the medium molecule of the thermal conductive element 12 that is in contact with the heat source 11 has absorbed enough heat energy, the electrons of the medium molecule jump to a higher energy level and hit the electrons of the neighboring medium molecule in the thermal conductive element 12, to transfer the absorbed heat, then return to a lower energy level until the heat energy is transferred to the edges of the thermal conductive element 12. The heat dissipation apparatus of the invention further includes a vibration source 30 located on the thermal conductive element 12 at the juncture of the radiation fins. The vibration source 30 is a micro motor with an eccentric rotor to generate vibration energy, to accelerate heat transfer from the heat source 11 through the radial radiation fins to the edges of the thermal conductive element 12. Hence, after the medium molecule has absorbed vibration energy, its electrons can jump to a higher energy level by absorbing a little more energy and hit the electrons of the neighboring medium molecule to transfer the absorbed heat energy and return to a lower energy level until the heat energy is transferred to the edges of the thermal conductive element 12. Then heat exchange with the external cooling air may be performed. By repeating the heat transfer quickly in this manner, the cooling efficiency increases.

Since the CPU, namely the heat source 11, can't fully withstand vibration from a vertical direction, the vibration direction of the vibration source 30 may be set in parallel with the bonding direction of the thermal conductive element 12 on the heat source 11, so that vibration of the vibration source 30 does not produce a harmful effect on the CPU or heat source 11. Of course, if the heat source 11 is in other form, the vibration direction of the vibration source 30 may be set differently.

Figure 3:
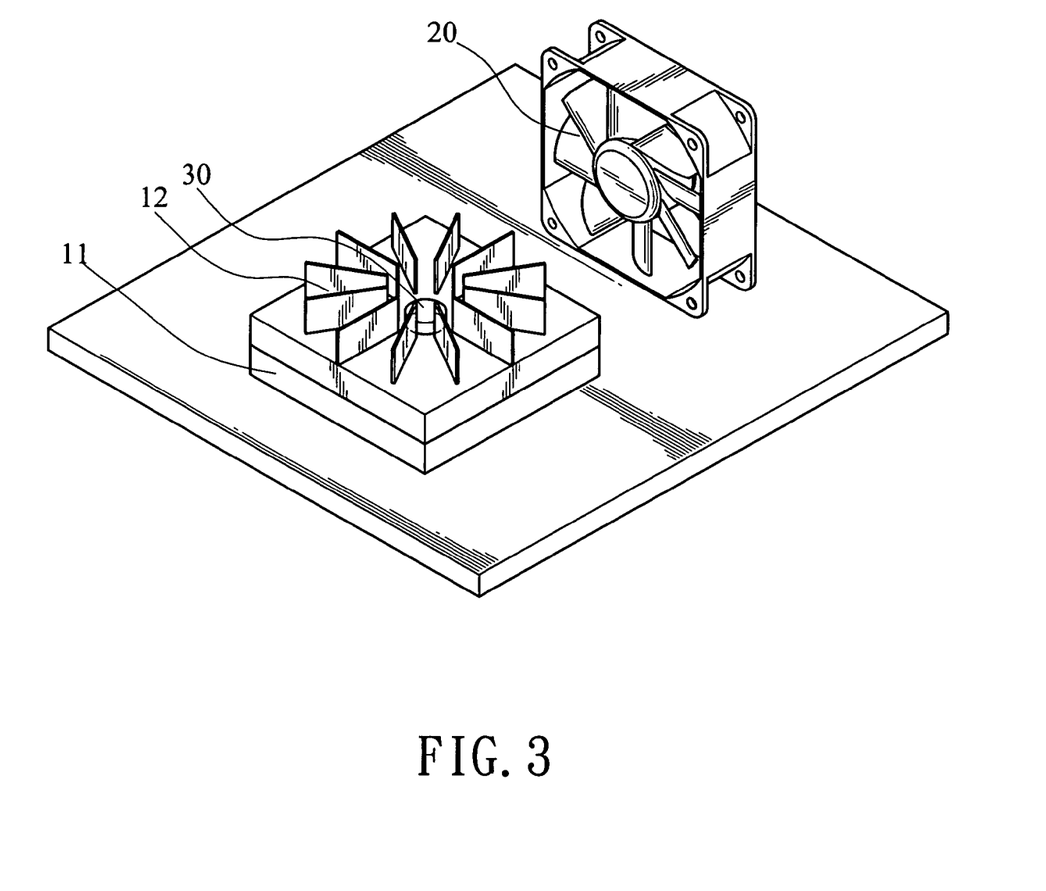
FIG. 3 is a schematic view of the second embodiment of the heat dissipation apparatus and a fan of the invention used on a CPU.

Refer to FIG. 3 for a second embodiment of the heat dissipation apparatus and a fan of the invention used on a CPU. The fan 20 is added to one side of the thermal conductive element 12, to channel outside cooling air rapidly through the thermal conductive element 12, to perform heat exchange between the edges of the thermal conductive element 12 and the external cooling air, to improve cooling efficiency. Of course, the fan 20 may also be mounted above the thermal conductive element 12.

Figure 4:
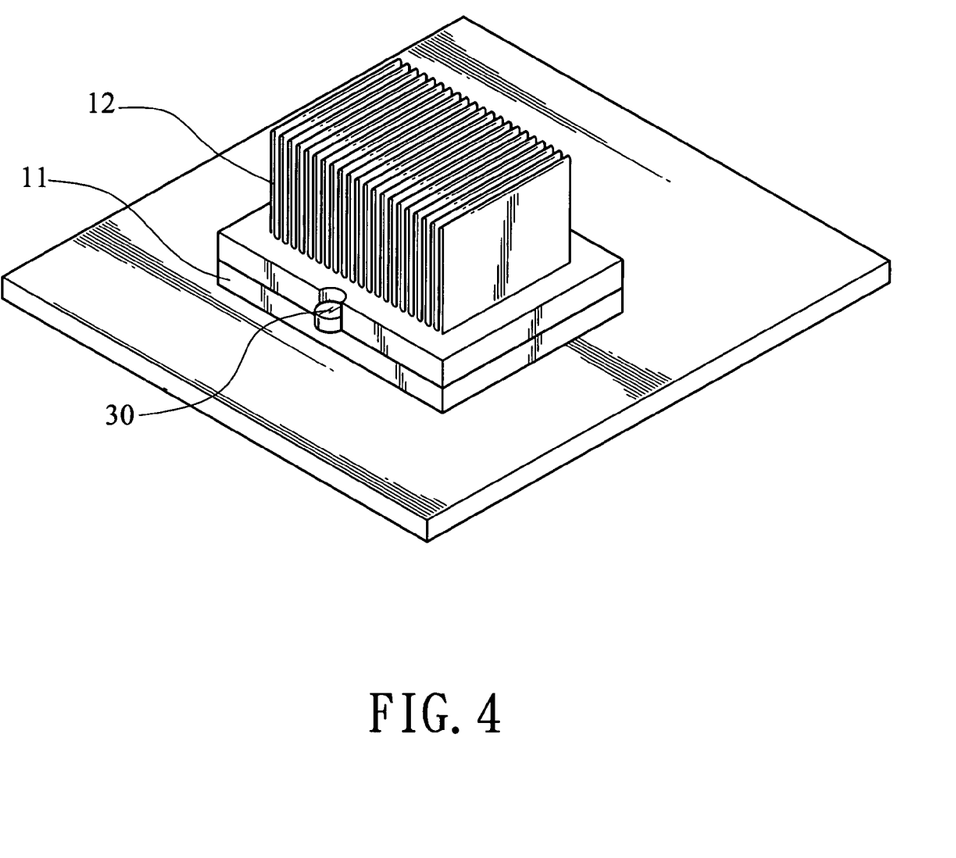
FIG. 4 is a schematic view of the third embodiment of the heat dissipation apparatus of the invention used on a CPU.
Figure 5:
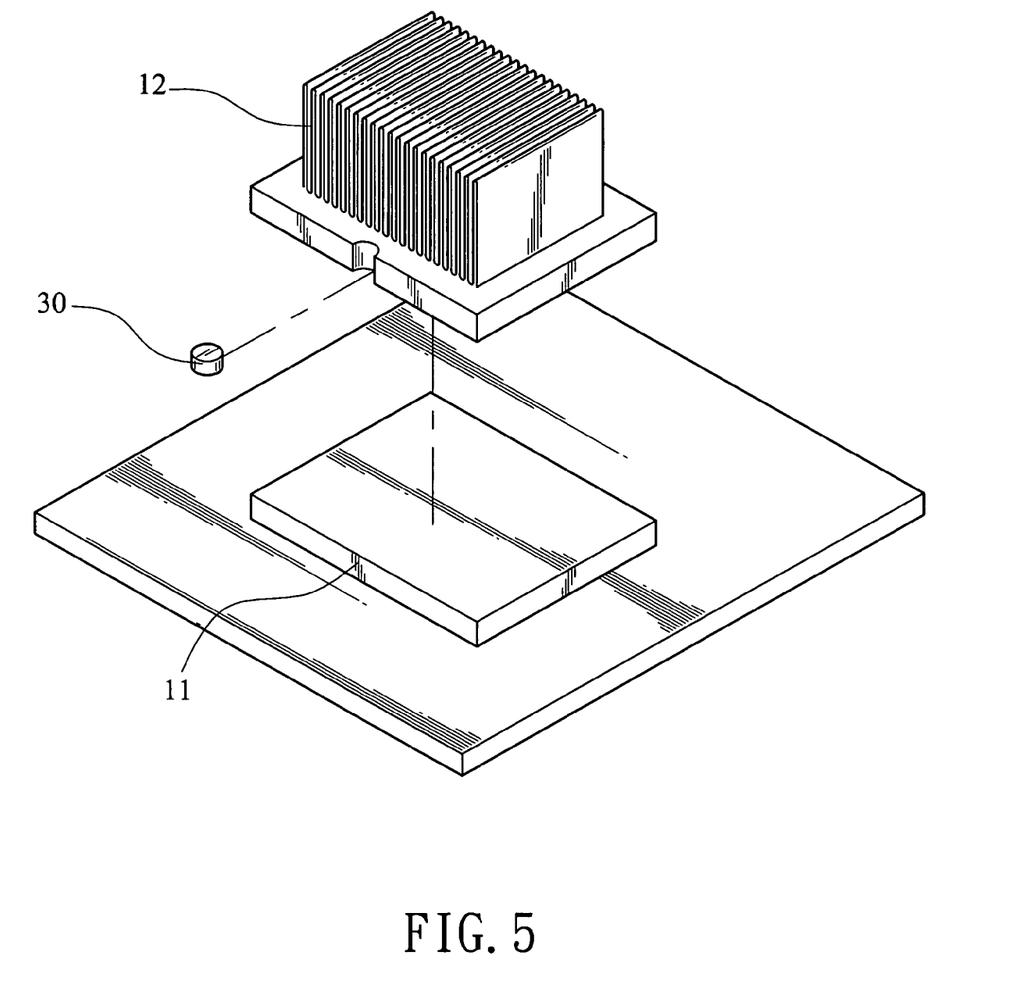
FIG. 5 is an exploded view of the third embodiment of the invention.

Refer to FIGS. 4 and 5 for the third embodiment of the heat dissipation apparatus of the invention used on a CPU. The heat dissipation apparatus according to the invention aims to dissipate heat from a heat source 11, which may be a heat-generating element of electronic devices. In a computer system, a CPU is the element that generates the most heat. In this embodiment, a CPU is used as a heat source 11 for an example. The heat source 11 is bonded to a thermal conductive element 12. The thermal conductive element 12, shown in the drawings, has parallel radiation fins. Heat energy generated by the heat source 11 is transferred to the thermal conductive element 12 by conduction. After the medium molecule of the thermal conductive element 12, that is in contact with the heat source 11, has absorbed enough heat energy, the electrons of the medium molecule jump to a higher energy level and hit the electrons of the neighboring medium molecule in the thermal conductive element 12, to transfer the absorbed heat, then return to a lower energy level until the heat energy is transferred to the edges of the thermal conductive element 12. The heat dissipation apparatus of the invention further includes a vibration source 30 located on the thermal conductive element 12. The vibration source 30 is a micro motor with an eccentric rotor to generate vibration energy, to accelerate heat transfer from the heat source 11 through the parallel radiation fins to the edges of the thermal conductive element 12. The heat transfer to the edges may be accomplished rapidly because the vibration source 30 is located on a lateral end of the radiation fins. Hence, after the medium molecule has absorbed vibration energy, its electrons can jump to a higher energy level by absorbing a little more energy and hit the electrons of the neighboring medium molecule, to transfer the absorbed heat energy and return to the lower energy level, until the heat energy is transferred to the edges of the thermal conductive element 12. Then heat exchange with the external cooling air may be performed. By repeating the heat transfer quickly in this manner, the cooling efficiency increases.

Since the CPU, namely the heat source 11, can't fully withstand vibration from a vertical direction, the vibration direction of the vibration source 30 may be set in parallel with the bonding direction of the thermal conductive element 12 on the heat source 11, so that vibration of the vibration source 30 does not produce a harmful effect on the CPU or heat source 11. Of course, if the heat source 11 is in other form, the vibration direction of the vibration source 30 may be set differently. And a fan may be added to further improve cooling efficiency.

Figure 6:
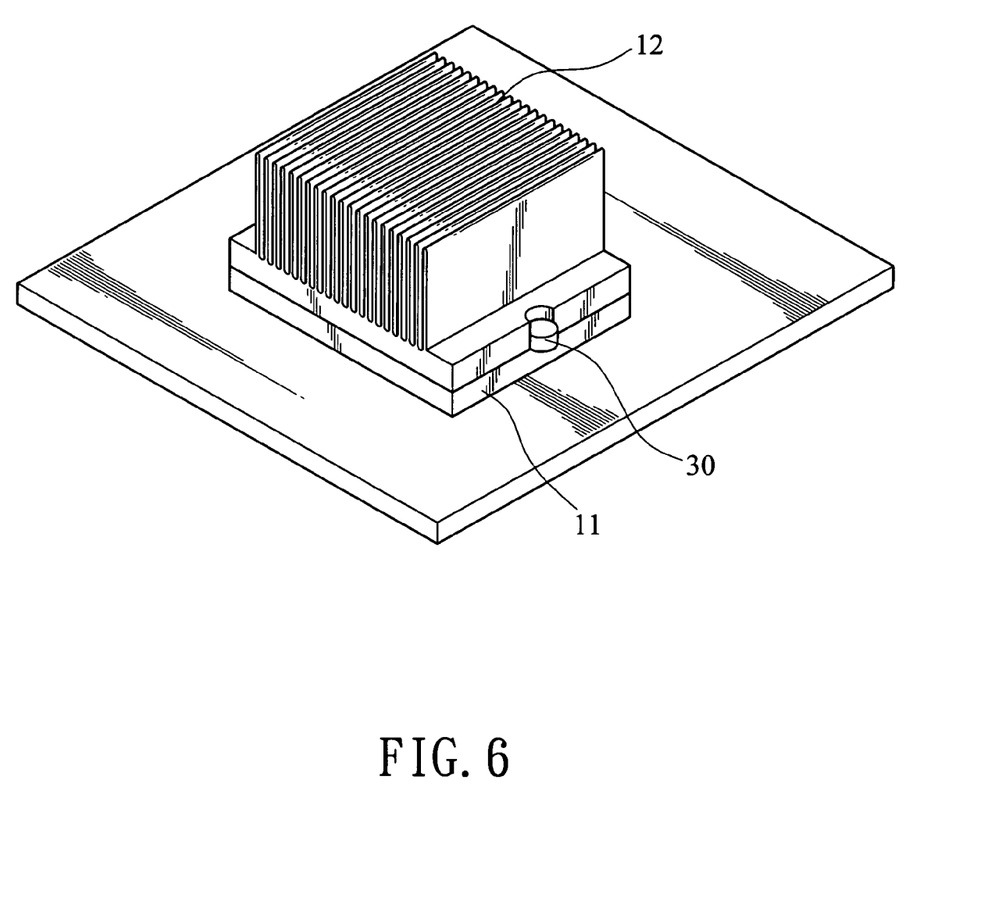
FIG. 6 is a schematic view of the fourth embodiment of the heat dissipation apparatus of the invention used on a CPU.
Figure 7:
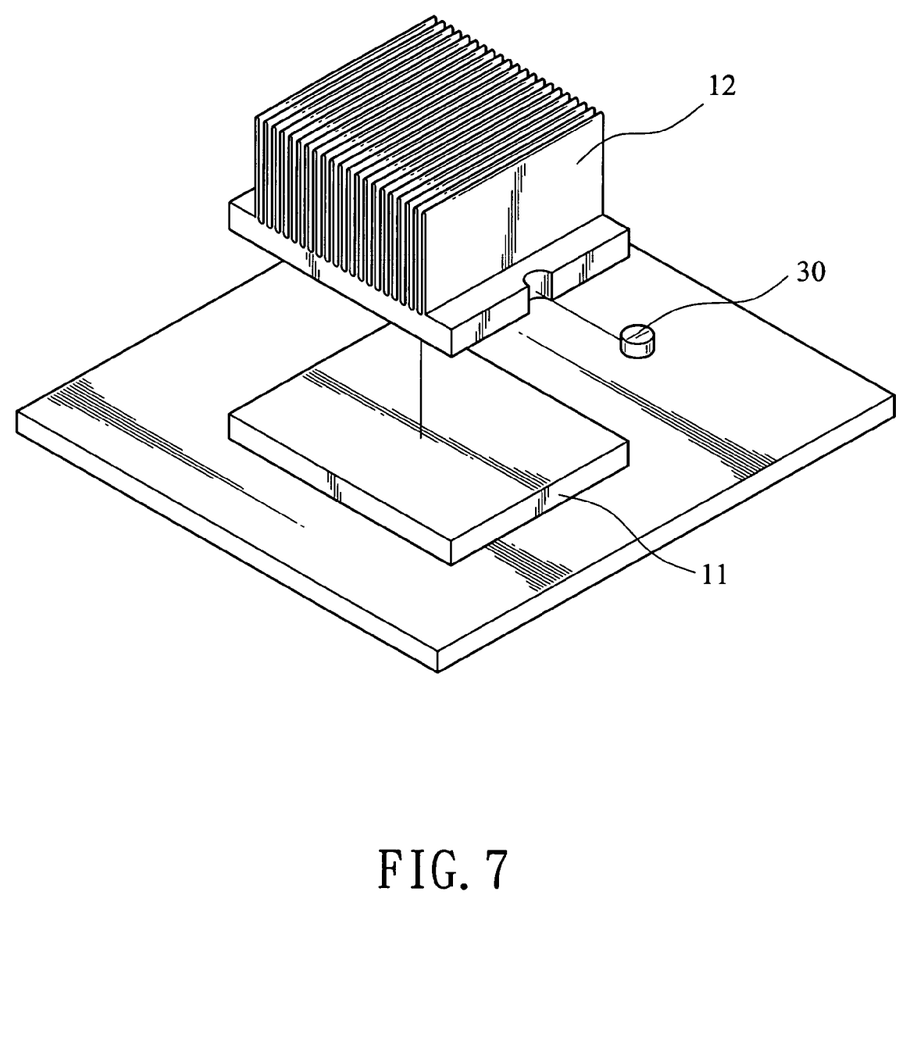
FIG. 7 is an exploded view of the fourth embodiment of the invention.

Refer to FIGS. 6 and 7 for the fourth embodiment of the heat dissipation apparatus of the invention used on a CPU. The heat dissipation apparatus according to the invention aims to dissipate heat from a heat source 11, which may be a heat-generating element of electronic devices. In a computer system, a CPU is the element that generates the most heat. In this embodiment, a CPU is used as a heat source 11 for an example. The heat source 11 is bonded to a thermal conductive element 12. The thermal conductive element 12 shown in the drawings has parallel radiation fins. Heat energy generated by the heat source 11 is transferred to the thermal conductive element 12 by conduction. After the medium molecule of the thermal conductive element 12 that is in contact with the heat source 11 has absorbed enough heat energy, the electrons of the medium molecule jump to a higher energy level and hit the electrons of the neighboring medium molecule in the thermal conductive element 12, to transfer the absorbed heat, then return to a lower energy level until the heat energy is transferred to the edges of the thermal conductive element 12. The heat dissipation apparatus of the invention further includes a vibration source 30 located on the thermal conductive element 12. The vibration source 30 is a micro motor with an eccentric rotor to generate vibration energy to accelerate heat transfer from the heat source 11 through the parallel radiation fins to the edges of the thermal conductive element 12. Hence, after the medium molecule has absorbed vibration energy, its electrons can jump to a higher energy level by absorbing a little more energy and hit the electrons of the neighboring medium molecule to transfer the absorbed heat energy and return to a lower energy level until the heat energy is transferred to the edges of the thermal conductive element 12. Then heat exchange with the external cooling air may be performed. By repeating the heat transfer quickly in this manner, the cooling efficiency increases.

Since the CPU, namely the heat source 11, can't fully withstand vibration from a vertical direction, the vibration direction of the vibration source 30 may be set in parallel with the bonding direction of the thermal conductive element 12 on the heat source 11, so that vibration of the vibration source 30 does not produce a harmful effect on the CPU or heat source 11. Of course, if the heat source 11 is in other form, the vibration direction of the vibration source 30 may be set differently. And a fan may be added to further improve cooling efficiency.

Figure 8:
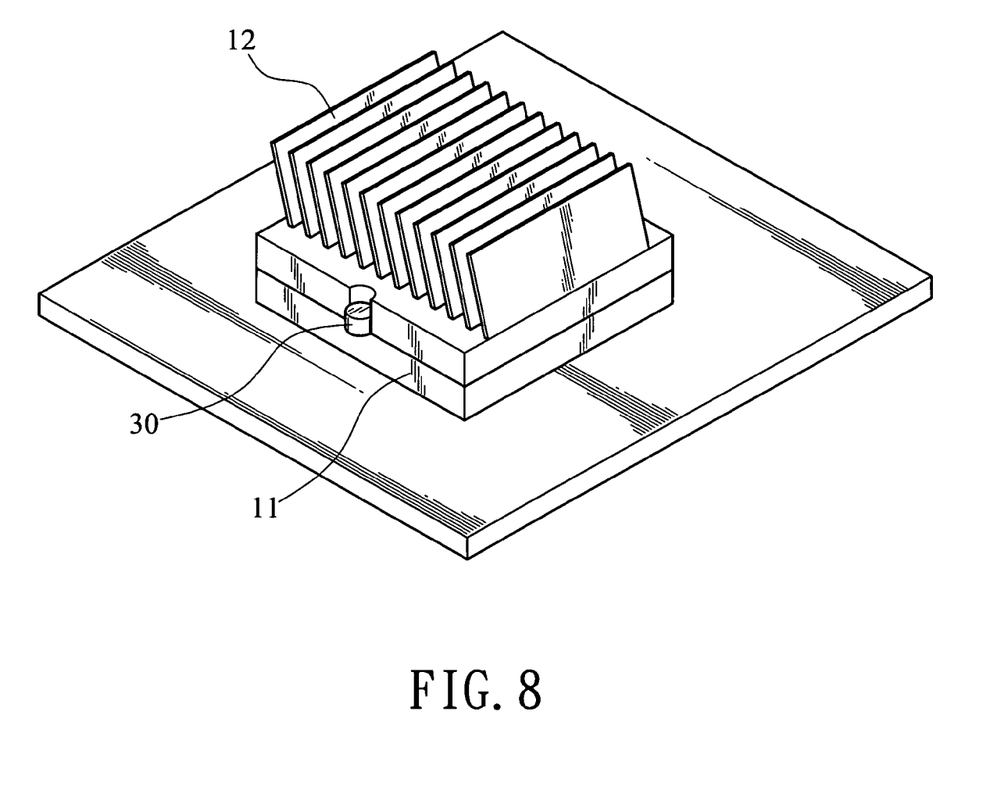
FIG. 8 is a schematic view of the fifth embodiment of the heat dissipation apparatus of the invention used on a CPU.

Refer to FIG. 8 for a fifth embodiment of the heat dissipation apparatus of the invention used on a CPU. In this embodiment the thermal conductive element 12 has radiation fins located thereon in an inclined manner to increase the heat dissipation area and improve cooling efficiency. A vibration source 30 is provided and located on a lateral side of the radiation fins.

Figure 9:
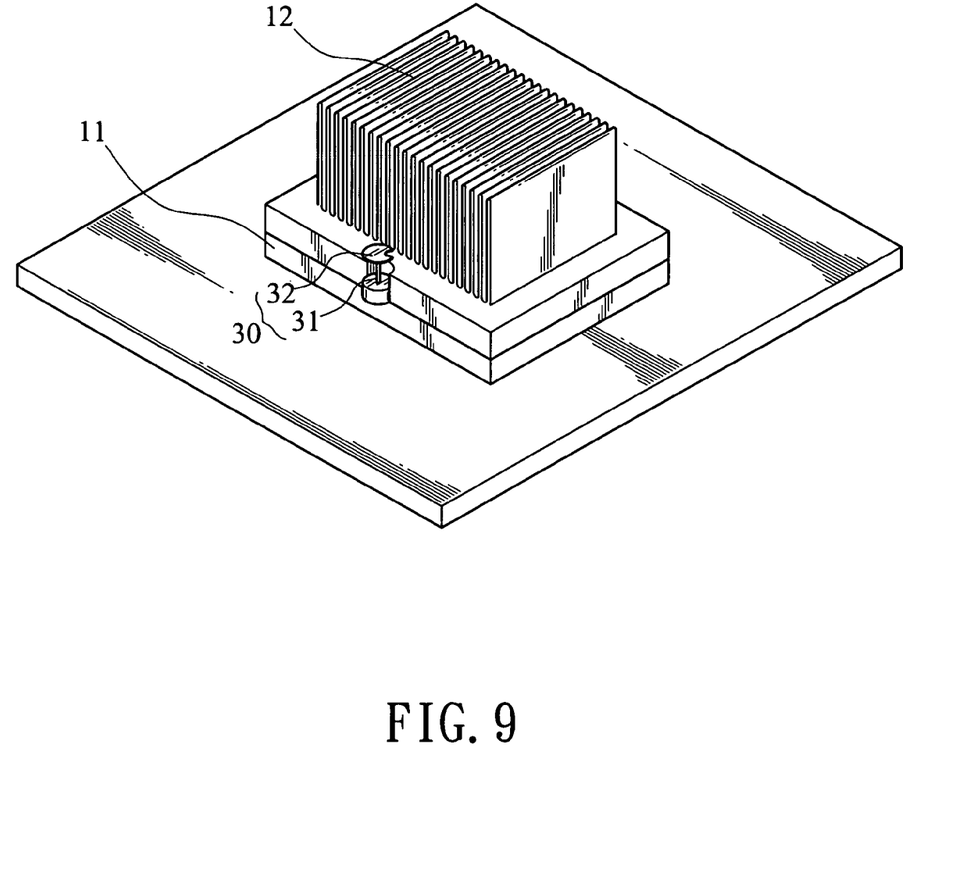
FIG. 9 is a schematic view of the sixth embodiment of the heat dissipation apparatus of the invention used on a CPU.
Figure 10:
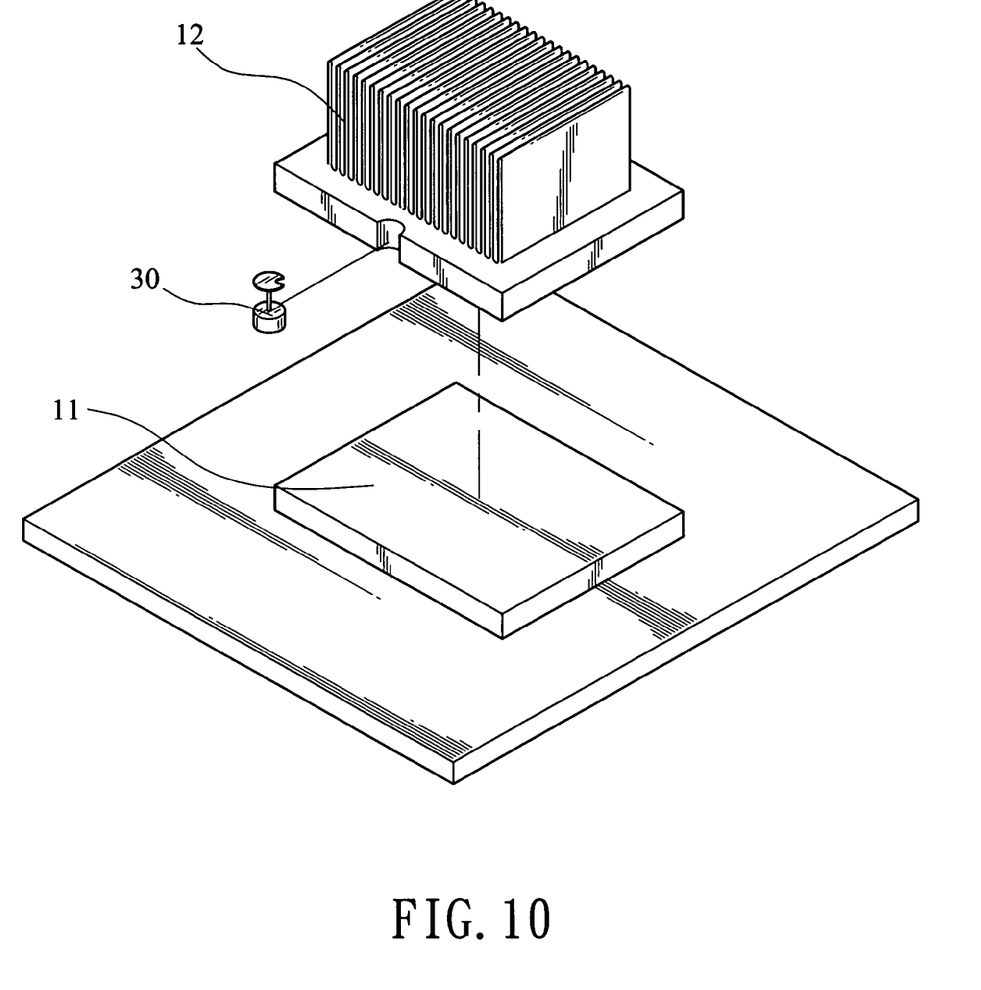
FIG. 10 is an exploded view of the sixth embodiment of the invention.

Refer to FIGS. 9 and 10 for the sixth embodiment of the heat dissipation apparatus of the invention used on a CPU. The heat dissipation apparatus according to the invention aims to dissipate heat from a heat source 11, which may be a heat-generating element of electronic devices. In a computer system, a CPU is the element that generates the most heat. In this embodiment, a CPU is used as a heat source 11 for an example. The heat source 11 is bonded to a thermal conductive element 12. The thermal conductive element 12 shown in the drawings has parallel radiation fins. Heat energy generated by the heat source 11 is transferred to the thermal conductive element 12 by conduction. After the medium molecule of the thermal conductive element 12 that is in contact with the heat source 11 has absorbed enough heat energy, the electrons of the medium molecule jump to a higher energy level and hit the electrons of the neighboring medium molecule in the thermal conductive element 12, to transfer the absorbed heat, then return to a lower energy level until the heat energy is transferred to the edges of the thermal conductive element 12. The heat dissipation apparatus of the invention further includes a vibration source 30 located on the thermal conductive element 12. The vibration source 30 is a micro motor with an eccentric rotor. The rotor includes a spindle 31 and a weight 32 coupled on one end of the spindle 31, to generate vibration energy, accelerating heat transfer from the heat source 11 through the parallel radiation fins to the edges of the thermal conductive element 12. Hence, after the medium molecule has absorbed vibration energy, its electrons can jump to a higher energy level by absorbing a little more energy and hit the electrons of the neighboring medium molecule to transfer the absorbed heat energy and return to a lower energy level until the heat energy is transferred to the edges of the thermal conductive element 12. Then heat exchange with the external cooling air may be performed. By repeating the heat transfer quickly in this manner, cooling efficiency increases.

Since the CPU, namely the heat source 11, can't fully withstand vibration from a vertical direction, the vibration direction of the vibration source 30 may be set in parallel with the bonding direction of the thermal conductive element 12, so that vibration of the vibration source 30 does not produce a harmful effect on the CPU or heat source 11. Of course, if the heat source 11 is in other form, the vibration direction of the vibration source 30 may be set differently. A fan may also be added to further improve cooling efficiency. The vibration source 30 may also be mounted on a lateral side of the radiation fins.

By means of the construction set forth above, the heat source is bonded to a thermal conductive element 12, to transfer heat energy, and a vibration source is mounted on the thermal conductive element to accelerate heat transfer of the thermal conductive element to the edges thereof to perform heat exchange with external cooling air, therefore cooling efficiency increases.

The vibration direction of the vibration source may be in parallel with the bonding direction of the thermal conductive element on the heat source. The vibration source is a micro motor including an eccentric rotor to generate vibration energy. The rotor may include a spindle and a weight coupled on one end of the spindle. A fan may be added on one side of a thermal conductive element to further improve cooling efficiency.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A heat dissipation apparatus for dissipating heat from a heat source, comprising:
   a thermal conductive element bonded to the heat source for transferring heat energy generated by the heat source, the thermal conductive element having a plurality of radiation fins arranged in a radial manner; and
   a vibration source located on the thermal conductive element, on a junction of the radiation fins, to accelerate transfer of the heat energy to edges of the thermal conductive element to perform heat exchange with external cooling air, thereby improving cooling efficiency.

2. The heat dissipation apparatus of claim 1, wherein the vibration source has a vibration direction parallel with the bonding direction of the thermal conductive element on the heat source.

3. The heat dissipation apparatus of claim 1, wherein the vibration source is a micro motor.

4. The heat dissipation apparatus of claim 3, wherein the micro motor includes an eccentric rotor for generating vibration energy.

5. The heat dissipation apparatus of claim 4, wherein the rotor includes a spindle and a weight coupled on one end of the spindle.

6. The heat dissipation apparatus of claim 1, further including a fan disposed to blow air on said thermal conductive element.

7. A heat dissipation method for dissipating heat from a heat source, comprising:
   bonding a thermal conductive element to the heat source for transferring heat energy generated by the heat source to the thermal conductive element, the thermal conductive element having a plurality of radiation fins arranged in parallel; and mounting a vibration source onto the thermal conductive element, on a lateral side of the radiation fins, for accelerating transfer of the heat energy to edges of the thermal conductive element, to perform heat exchange with external cooling air, thereby improving cooling efficiency.

8. The heat dissipation method of claim 7, wherein the vibration source has a vibration direction parallel with the bonding direction of the thermal conductive element on the heat source.

9. The heat dissipation method of claim 7, wherein the vibration source is a micro motor.

10. The heat dissipation method of claim 9, wherein the micro motor includes an eccentric rotor for generating vibration energy.

11. The heat dissipation method of claim 10, wherein the rotor includes a spindle and a weight coupled on one end of the spindle.

12. The heat dissipation method of claim 11, further including a fan disposed to blow air on the thermal conductive element.

13. The heat dissipation method of claim 7, wherein the radiation fins are arranged in an inclined manner.

14. A heat dissipation apparatus for dissipating heat from a heat source, comprising:

a thermal conductive element bonded to the heat source for transferring heat energy generated by the heat source, the thermal conductive element having a plurality of radiation fins arranged in parallel; and a vibration source located on the thermal conductive element, on a lateral end of the radiation fins, to accelerate transfer of the heat energy to edges of the thermal conductive element to perform heat exchange with external cooling air, thereby improving cooling efficiency.

15. The heat dissipation apparatus of claim 14, wherein the vibration source has a vibration direction parallel with the bonding direction of the thermal conductive element on the heat source.

16. The heat dissipation apparatus of claim 14, wherein the vibration source is a micro motor.

17. The heat dissipation apparatus of claim 16, wherein the micro motor includes an eccentric rotor for generating vibration energy.

18. The heat dissipation apparatus of claim 17, wherein the rotor includes a spindle and a weight coupled on one end of the spindle.

19. The heat dissipation apparatus of claim 14, further including a fan disposed to blow air on said thermal conductive element.

* * * * *